United States Patent
Cheng et al.

(10) Patent No.: US 9,853,132 B2
(45) Date of Patent: *Dec. 26, 2017

(54) NANOSHEET MOSFET WITH FULL-HEIGHT AIR-GAP SPACER

(71) Applicant: International Business Machines Corporation, Armonk, NY (US)

(72) Inventors: Kangguo Cheng, Schenectady, NY (US); Bruce B. Doris, Slingerlands, NY (US); Michael A. Guillorn, Cold Springs, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/289,467

(22) Filed: Oct. 10, 2016

(65) Prior Publication Data

US 2017/0141207 A1    May 18, 2017

Related U.S. Application Data

(60) Continuation of application No. 15/146,031, filed on May 4, 2016, now Pat. No. 9,508,829, which is a
(Continued)

(51) Int. Cl.
*H01L 29/66* (2006.01)
*H01L 23/528* (2006.01)
(Continued)

(52) U.S. Cl.
CPC .... *H01L 29/6681* (2013.01); *H01L 21/28247* (2013.01); *H01L 21/7682* (2013.01);
(Continued)

(58) Field of Classification Search
CPC .......... H01L 21/02532; H01L 21/0259; H01L 21/02603; H01L 21/28247; H01L 21/283;
(Continued)

(56) References Cited

U.S. PATENT DOCUMENTS 9,362,355 B1   6/2016 Cheng et al.
9,508,829 B1   11/2016 Cheng et al.
(Continued)

OTHER PUBLICATIONS

List of IBM Patents or Patent Applications Treated as Related; (Appendix P), Filed Jul. 6, 2017; 2 pages.

*Primary Examiner* — Allan R Wilson
(74) *Attorney, Agent, or Firm* — Cantor Colburn LLP; Vazken Alexanian

(57) ABSTRACT

A semiconductor device includes a gate positioned on a substrate; a nanosheet that extends through the gate, protrudes from a sidewall of the gate, and forms a recess between the substrate and the nanosheet; a dielectric spacer disposed in the recess; a source/drain contact positioned on a source/drain disposed on the substrate adjacent to the gate; an air gap spacer positioned along the sidewall of the gate and in contact with a dielectric material disposed on the nanosheet, the air gap spacer being in contact with the source/drain contact; and an interlayer dielectric (ILD) disposed on the air gap spacer.

18 Claims, 13 Drawing Sheets

Related U.S. Application Data division of application No. 14/940,685, filed on Nov. 13, 2015, now Pat. No. 9,362,355.

(51) Int. Cl.

| | | |
|---|---|---|
| *H01L 23/532* | (2006.01) | |
| *H01L 23/522* | (2006.01) | |
| *H01L 21/768* | (2006.01) | |
| *H01L 29/06* | (2006.01) | |
| *H01L 21/28* | (2006.01) | |

(52) U.S. Cl.
CPC ........ *H01L 23/528* (2013.01); *H01L 23/5226* (2013.01); *H01L 23/5329* (2013.01); *H01L 29/0665* (2013.01); *H01L 29/6653* (2013.01); *H01L 29/66553* (2013.01); *H01L 29/0673* (2013.01)

(58) Field of Classification Search
CPC ............. H01L 21/7682; H01L 23/5226; H01L 23/528; H01L 23/5329; H01L 29/0653; H01L 29/0665; H01L 29/0673; H01L 29/16; H01L 29/6653; H01L 29/66545; H01L 29/66553; H01L 29/666742; H01L 29/66795; H01L 29/6681; H01L 29/78

See application file for complete search history.

(56) References Cited

U.S. PATENT DOCUMENTS

| | | | | |
|---|---|---|---|---|
| 9,647,098 | B2* | 5/2017 | Obradovic | H01L 29/66977 |
| 2010/0295024 | A1* | 11/2010 | Pernel | B82Y 10/00 |
| | | | | 257/24 |
| 2014/0001441 | A1* | 1/2014 | Kim | H01L 29/0673 |
| | | | | 257/29 |
| 2016/0071729 | A1* | 3/2016 | Hatcher | H01L 29/1033 |
| | | | | 257/347 |
| 2016/0111337 | A1* | 4/2016 | Hatcher | H01L 21/823807 |
| | | | | 438/154 |
| 2016/0163796 | A1* | 6/2016 | Obradovic | B82Y 10/00 |
| | | | | 257/9 |
| 2017/0110554 | A1* | 4/2017 | Tak | H01L 29/4991 |

* cited by examiner

NANOSHEET MOSFET WITH FULL-HEIGHT AIR-GAP SPACER

DOMESTIC PRIORITY

This application is a continuation of and claims priority from U.S. patent application Ser. No. 15/146,031, filed on May 4, 2016, entitled "NANOSHEET MOSFET WITH FULL-HEIGHT AIR-GAP SPACER," which is a divisional and claims priority from U.S. patent application Ser. No. 14/940,685, filed on Nov. 13, 2015, entitled "NANOSHEET MOSFET WITH FULL-HEIGHT AIR-GAP SPACER," each application is incorporated by reference in its entirety.

BACKGROUND

The present invention relates to metal-oxide-semiconductor field-effect transistors (MOSFET), and more specifically, to nanosheet transistors.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

As semiconductor devices scale to smaller dimensions, nanosheet (nanowire) devices provide advantages. Stacked nanowires provide area efficiency. Stacked nanowires provide, for example, increased drive current within a given layout area.

SUMMARY

According to an embodiment, a method of making a semiconductor device includes forming a nanosheet stack including a first nanosheet in contact with a substrate and a second nanosheet disposed on the first nanosheet; depositing a dielectric layer on an exposed surface of the second nanosheet; forming a gate including a sacrificial gate material on the nanosheet stack and the dielectric layer, a gate spacer positioned along a sidewall of the gate; removing an end portion of the first nanosheet to form a lateral recess beneath the gate spacer; depositing a dielectric material in the lateral recess; forming a source/drain on the substrate adjacent to the gate; replacing the sacrificial gate material with a conductive gate stack; removing remaining portions of the first nanosheet; forming a source/drain contact on the source/drain and adjacent to the gate spacer; removing the gate spacer to expose the dielectric layer on the nanosheet stack and form an air gap spacer; and depositing an interlayer dielectric (ILD) on the air gap spacer.

According to another embodiment, a method of making a semiconductor device includes forming a nanosheet stack including a first nanosheet in contact with a substrate and a second nanosheet disposed on the first nanosheet; depositing a dielectric layer on the second nanosheet; forming a gate including a sacrificial gate material on the nanosheet stack and the dielectric layer, a gate spacer positioned along a sidewall of the gate; recessing the nanosheet stack to remove portions that extend beyond the gate spacer; removing end portions of the first nanosheets that are positioned beneath the gate spacer to form voids between the second nanosheets; depositing a dielectric material in the voids; forming source/drains on the substrate adjacent to the gate; removing the sacrificial gate material to form a gate trench on the nanosheet stack and expose the dielectric layer disposed on the nanosheet stack; removing an exposed portion of the dielectric layer; depositing a conductive gate stack in the gate trench and on the nanosheet stack; removing remaining portions of the first nanosheet; forming source/drain contacts on the source/drains; removing the gate spacer to expose the dielectric layer on the nanosheet stack and form an air gap spacer; and depositing an interlayer dielectric (ILD) on the air gap spacer to form a seal.

Yet, according to another embodiment, a semiconductor device includes a gate positioned on a substrate; a nanosheet that extends through the gate, protrudes from a sidewall of the gate, and forms a recess between the substrate and the nanosheet; a dielectric spacer disposed in the recess; a source/drain contact positioned on a source/drain disposed on the substrate adjacent to the gate; an air gap spacer positioned along the sidewall of the gate and in contact with a dielectric material disposed on the nanosheet, the air gap spacer being in contact with the source/drain contact; and an interlayer dielectric (ILD) disposed on the air gap spacer.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A and 1B illustrate a semiconductor device with a self-aligned source/drain contact positioned in contact with the gate spacer, in which:

FIG. 1A is a cross-sectional side view; and

FIG. 1B is a cross-sectional side view through the x-axis of FIG. 1A;

FIGS. 2A and 2B illustrate a semiconductor device according to various embodiments, in which:

FIG. 2A is a cross-sectional side view of the source/drain contact positioned in contact with an air gap spacer;

FIG. 2B is a cross-sectional side view through the x-axis of FIG. 2A;

FIGS. 3A-16B illustrate methods of making semiconductor devices according to various embodiments, in which:

FIG. 3A is a cross-sectional side view of a nanosheet stack including alternating layers of a first nanosheet and a second nanosheet disposed on a substrate;

FIG. 9 is a cross-sectional side view after removing the sacrificial material from the dummy gate;

FIG. 10 is a cross-sectional side view after removing the exposed dielectric layer from the nanosheet stack;

FIG. 11 is a cross-sectional side view after removing remaining portions of the first nanosheet;

FIG. 12 is a cross-sectional side view after depositing a gate stack in the gate recess;

FIG. 13 is a cross-sectional side view after recessing the gate stack and depositing a gate cap on the recessed gate stack;

FIG. 14 is a cross-sectional side view after forming source/drain contacts on the source/drain regions;

FIG. 16B is a cross-sectional side view through the x-axis of FIG. 16A.

DETAILED DESCRIPTION

As complementary metal oxide semiconductor (CMOS) devices scale to smaller dimensions, self-aligned contacts (SAC) promote contact yields. In a MOSFET with a SAC structure, the source/drain contact (TS) is positioned in contact with the gate spacer, which may contribute to gate-to-contact parasitic capacitance.

Figure 1B:
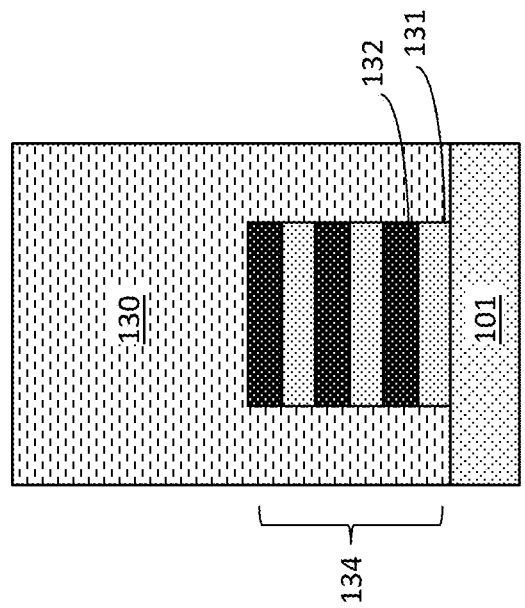
Figure 1A:
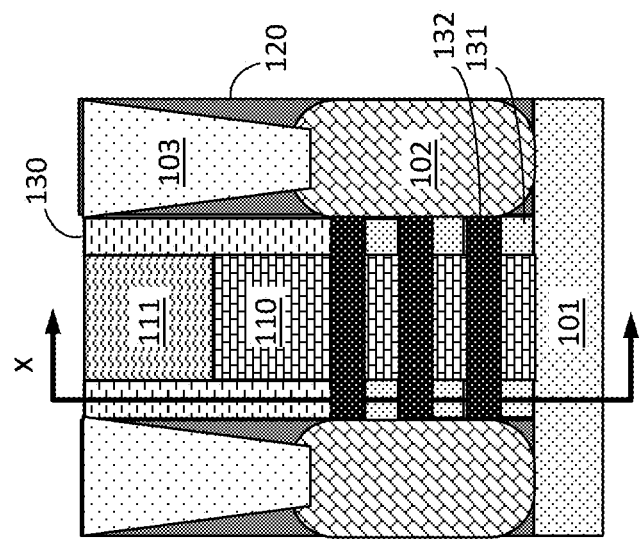

For example, FIGS. 1A and 1B illustrate a semiconductor device with a self-aligned source/drain contact 103 positioned in contact with the gate spacer 130. FIG. 1A is a cross-sectional side view. FIG. 1B is a cross-sectional side view through the x-axis of FIG. 1A.

A nanosheet stack 134 (FIG. 1B) including nanosheets 132 is formed on a substrate 101. The nanosheet stack 134 may be formed by, for example, growing alternative layers of a sacrificial material and the nanosheet material on a substrate (the thickness of the nanosheet material defines the thickness of the nanosheets); patterning the multi-layer stack into fin structures (the width of the fin structures defines the width of the nanosheets); and removing the sacrificial material in certain processing steps to release the nanosheets.

A gate stack 110 is formed on the nanosheet stack 134. The nanosheets 132 extend through the gate stack 110. Gate spacers 130 (cladding spacers) are formed along sidewalls of the gate stack 134. Beneath the gate spacers 130, dielectric layers 131 alternate with the nanosheets 132. The dielectric layer 131 contacts the substrate 101. A gate cap 111 is formed on the recessed gate stack 110.

Source/drain regions 102 are positioned on the substrate 101 and on opposing sides of the gate stack 110. Source/drain contacts 103 are formed on the source/drain regions 102. An interlayer dielectric (ILD) 120 is disposed on and around the source/drain regions 102. Because the source/drain contact 103 is positioned in contact with the gate spacer 130, parasitic capacitance between the gate stack 110 and the source/drain contact 103 may occur.

Accordingly, various embodiments provide semiconductor nanosheet devices and methods of making semiconductor nanosheet devices with air gap spacers that reduce the gate-to-contact capacitance and improve the CMOS performance. Although removing the entire spacer to provide a full-height air gap spacer optimally reduces the parasitic capacitance, the full-height spacer may expose the gate stack (e.g., a high-k gate stack) to air and potentially degrade the gate stack quality. A protective dielectric layer disposed on the nanosheet stack protects the spacer from air and etchants and maintains gate stack quality. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2B:
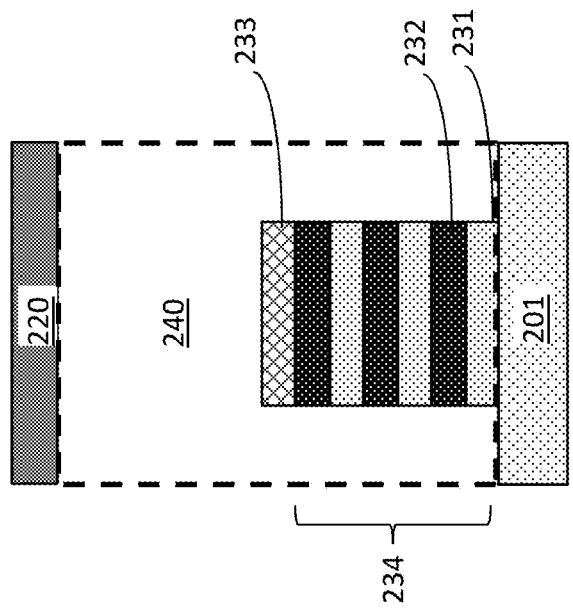
Figure 2A:
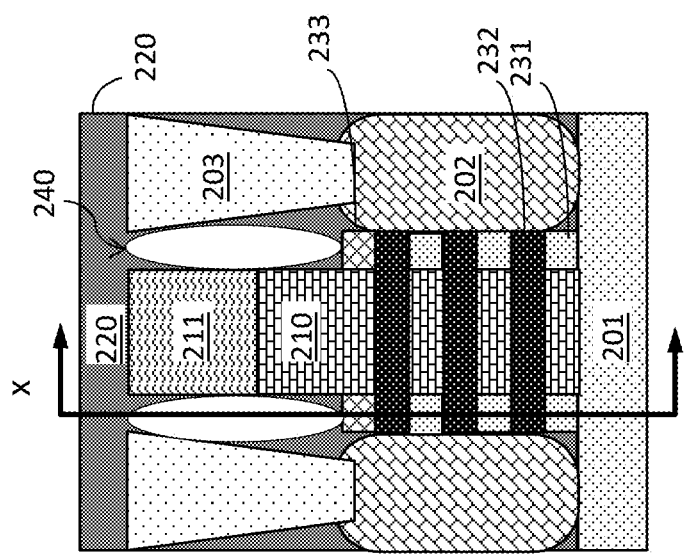

Turning again to the Figures, FIGS. 2A and 2B illustrate a semiconductor device according to various embodiments. FIG. 2A is a cross-sectional side view of the source/drain contacts 202 positioned in contact with an air gap spacer 240. FIG. 2B is a cross-sectional side view through the x-axis of FIG. 2A.

A nanosheet stack 234 (FIG. 2B) including nanosheets (referred to as second nanosheets 232 in FIGS. 3A-16B below) is formed on a substrate 201. A gate stack 210 is formed on the nanosheet stack 234. The nanosheets (second nanosheets 232) extend through the gate stack 210. An air gap spacer 240 is positioned along sidewalls of the gate stack 210. Beneath the air gap spacer 240, dielectric layers 231 alternate with nanosheets. The dielectric layer 231 contacts the substrate 101. An additional dielectric layer 233 is positioned on top of the nanosheet stack 234 and contacts the air gap spacer 240. The additional dielectric layer 233 may be the same material to protect the gate stack 210 from exposure to etchants and air.

Source/drain regions 202 are positioned on the substrate 201 and on opposing sides of the gate stack 210. Source/drain contacts 203 are formed on the source/drain regions 202. An interlayer dielectric (ILD) 220 is disposed around and between the source/drain contacts 203 and the source/drain regions 202. The air gap spacer 240 reduces the gate-to-contact parasitic capacitance and and prevents the gate stack 210 from being degraded.

Figure 3B:
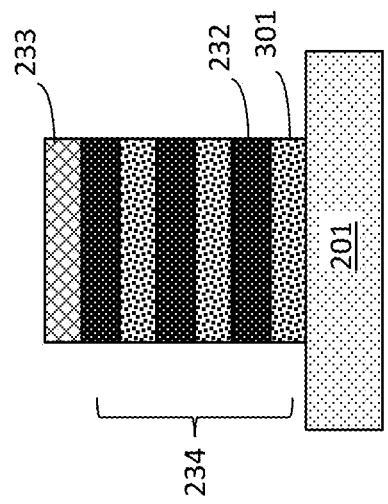
FIG. 3B is a cross-sectional side view through the x-axis of FIG. 3A.
Figure 3A:
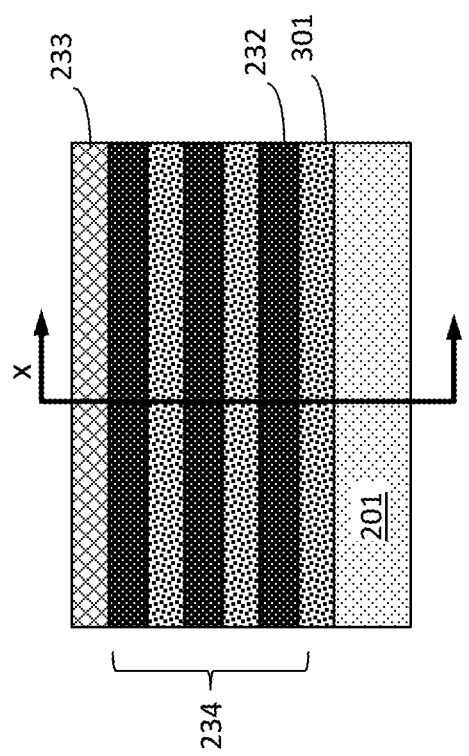

FIGS. 3A-16B illustrate methods of making semiconductor devices according to various embodiments. FIG. 3A is a cross-sectional side view of a nanosheet stack 234 disposed on a substrate 201. FIG. 3B is a cross-sectional side view through the x-axis of FIG. 3A.

The substrate 201 may include one or more semiconductor materials. Non-limiting examples of substrate 201 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates 201 include silicon-on-insulator (SOI) and silicon-germanium-on-insulator (SGOI) substrates with buried oxide (BOX) layers.

The nanosheet stack 234 includes alternating layers of a first nanosheet 301 and a second nanosheet 232. The first nanosheet 301 contacts the substrate 201. The first nanosheet 301 may be a semiconductor material, for example, silicon germanium. Other non-limiting examples of semiconductor materials for the first nanosheet 301 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

The second nanosheet 231 alternates with the first nanosheet 301 in the nanosheet stack 234. The second nanosheet 231 may be a semiconductor material, for example, silicon. Other non-limiting examples of semiconductor materials for the second nanosheet 231 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

Although nanosheet stack 234 includes three layers of first nanosheet 301 and three layers of second nanosheet 232, the nanosheet stack 234 may include any number of first nanosheets 301 and second nanosheets 232. The nanosheet stack 234 may include one or more layers of each of first nanosheet 301 and second nanosheet 232. For example, nanosheet stack 234 may include one layer of first nanosheet 301 positioned in contact with the substrate 201 and one layer of second nanosheet 232 disposed on the first nanosheet 301.

First and second nanosheets 301, 232 may be formed on the substrate 201 by for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

A dielectric layer 233 is disposed on the nanosheet stack 234. The dielectric layer 233 is disposed on the second nanosheet 232. The dielectric layer 233 may be a low-k dielectric material having, for example, a k of less than 5. The dielectric layer 233 may include, but is not limited to, silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, silicon borocarbonitride (SiBCN), or any combination thereof. The dielectric layer 233 may be formed by, for example, chemical vapor deposition (CVD), physical vapor deposition (PVD), plasma enhanced CVD, atomic layer deposition (ALD), evaporation, chemical solution deposition, or like processes.

A dry etch process, for example, a reactive ion etch (RIE) process, is performed to trim the sidewalls of the nanosheet stack 234 and the dielectric layer 233.

Figure 4B:
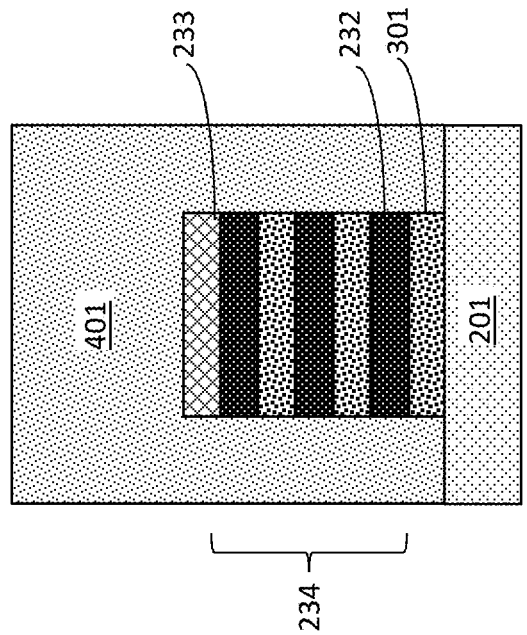
FIG. 4B is a cross-sectional side view through the x-axis of FIG. 4A.
Figure 4A:
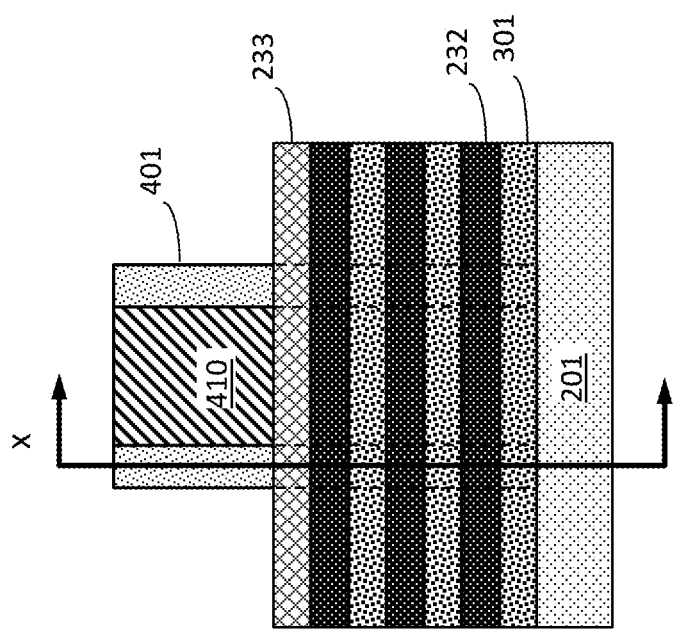
FIG. 4A is a cross-sectional side view after forming a dummy gate and gate spacers on the nanosheet stack.

FIG. 4A is a cross-sectional side view after forming a dummy gate and gate spacers 401 on the nanosheet stack 234. FIG. 4B is a cross-sectional side view through the x-axis of FIG. 4A.

The dummy gate (sacrificial gate) includes a sacrificial gate material 410. The sacrificial gate material 410 may be, for example, amorphous silicon (aSi) or polycrystalline silicon (polysilicon). The sacrificial gate material 410 may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

An insulating material, for example, silicon dioxide, silicon nitride, SiOCN, or SiBCN, is deposited on the sacrificial gate material 410. Other non-limiting examples of materials for the gates spacers 401 include dielectric oxides (e.g., silicon oxide), dielectric nitrides (e.g., silicon nitride), dielectric oxynitrides, or any combination thereof. The gate spacer 401 material is deposited by a deposition process, for example, chemical vapor deposition (CVD) or physical vapor deposition (PVD).

An anisotropic dry etch process, for example, reactive ion etch (RIE), is performed to form gate spacers 401 around the sacrificial gate material 410 of the dummy gates. When the gate spacers 401 are etched by an anisotropic process, some of the spacer material remains along the gate sidewalls and is not etched away because the thickness of the spacer material is larger in the vertical direction.

Figure 5B:
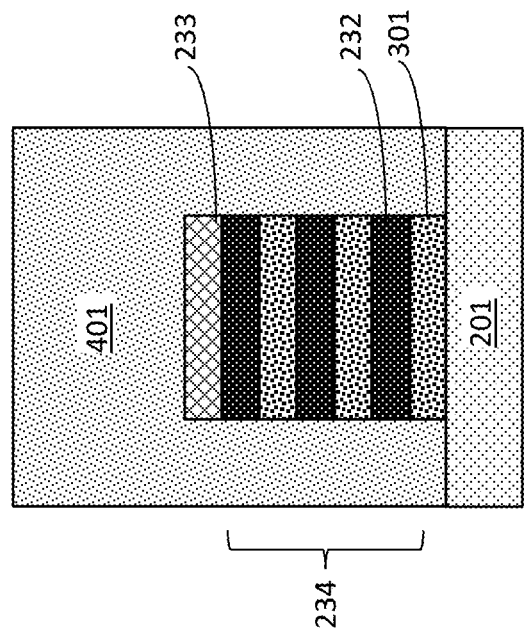
FIG. 5B is a cross-sectional side view through the x-axis of FIG. 5A.
Figure 5A:
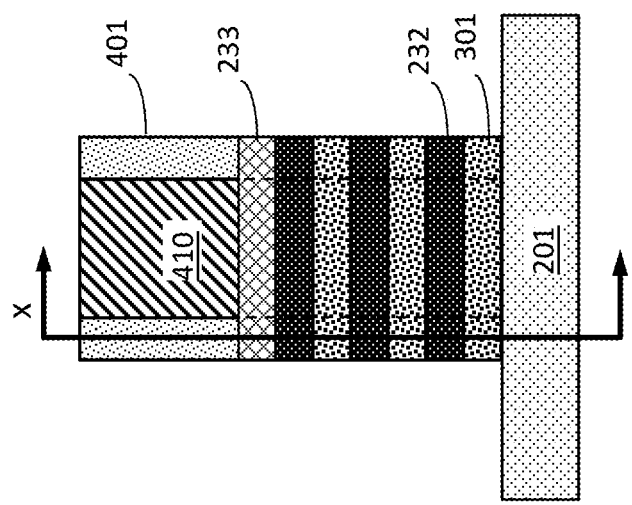
FIG. 5A is a cross-sectional side view after removing lateral portions of the nanosheet stack in the source/drain regions.

FIG. 5A is a cross-sectional side view after removing lateral portions (end portions) of the nanosheet stack 234. FIG. 5B is a cross-sectional side view through the x-axis of FIG. 5A.

Lateral portions of the nanosheet stack 234 that extend from the dummy gate (outside the sacrificial gate material 410 and the gate spacers 401) are recessed to expose the substrate 201 where the source/drain will be formed. The nanosheet stack 234 may be recessed by performing a dry etch process, for example, RIE.

Figure 6B:
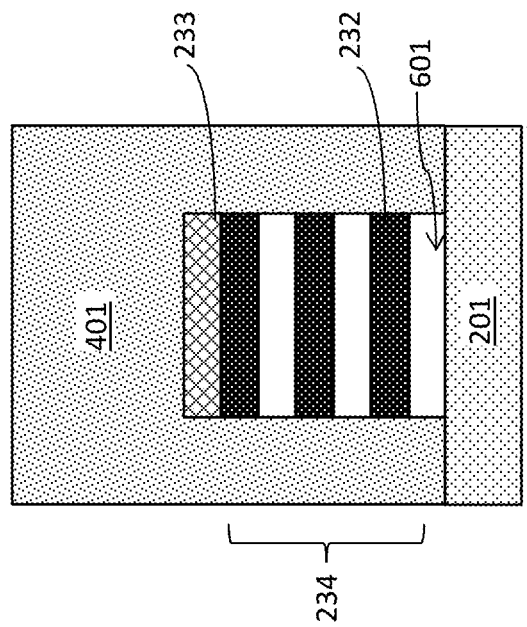
FIG. 6B is a cross-sectional side view through the x-axis of FIG. 6A.
Figure 6A:
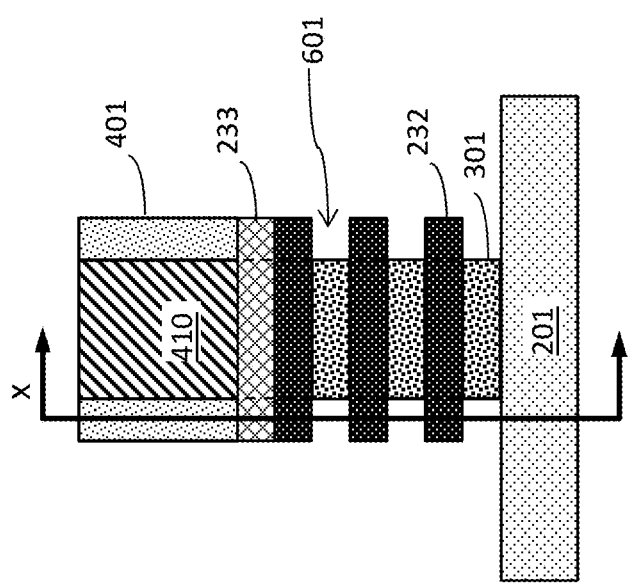
FIG. 6A is a cross-sectional side view after removing lateral portions of the first nanosheet from the nanosheet stack to form lateral recesses.

FIG. 6A is a cross-sectional side view after removing lateral portions (end portions) of the first nanosheet 301 from the nanosheet stack 234 to form lateral recesses 601 beneath the gate spacers 401. FIG. 6B is a cross-sectional side view through the x-axis of FIG. 6A. The second nanosheets 232 remain suspended in the dummy gate and positioned beneath the gate spacers 401.

A wet etch process is performed to form the lateral recesses 601 (voids) in the source/drain regions. The second nanosheet 232 protrudes from sidewalls of the gate beneath the gate spacer 401 to form the voids. The lateral recesses 601 are formed between the second nanosheets 232 beneath the gate spacer 401.

The wet etch process selectively removes the first nanosheet 301 and depends on the materials forming the first and second nanosheets 301, 232. The wet etch process may include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 7B:
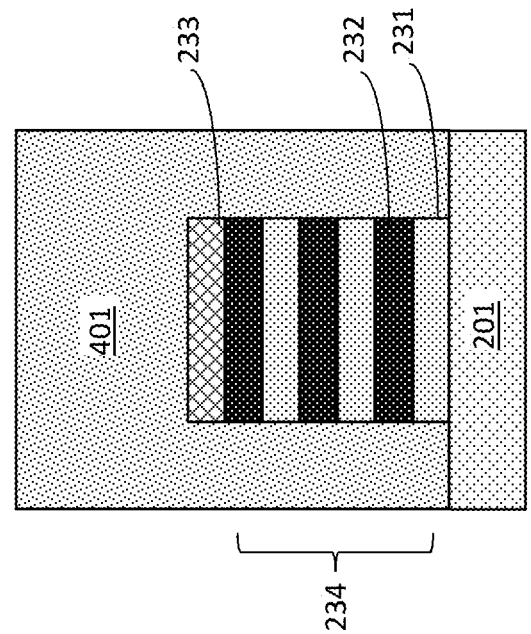
FIG. 7B is a cross-sectional side view through the x-axis of FIG. 7A.
Figure 7A:
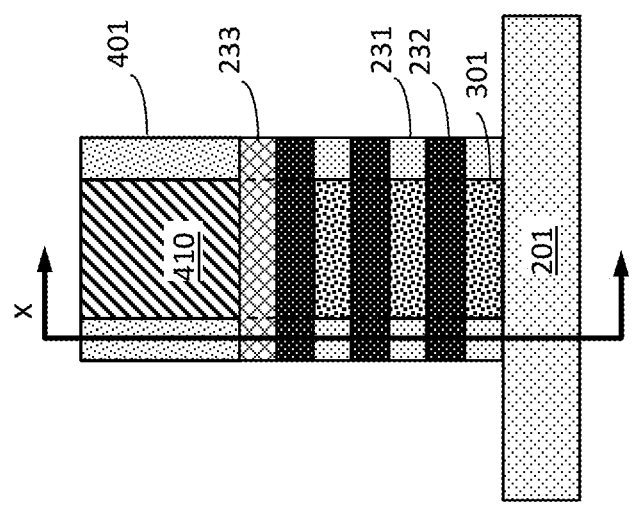
FIG. 7A is a cross-sectional side view after filling the lateral recesses with a replacement spacer material.

FIG. 7A is a cross-sectional side view after depositing (filling) the lateral recesses 601 with a replacement spacer material 231. FIG. 7B is a cross-sectional side view through the x-axis of FIG. 7A.

Figure 8B:
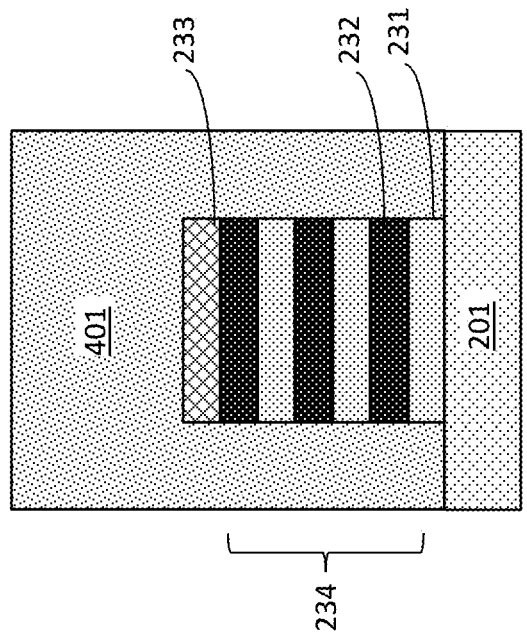
FIG. 8B is a cross-sectional side view through the x-axis of FIG. 8A.

The replacement spacer material 231 fills the gaps between the first nanosheets 232 beneath the gate spacers 401. As shown in FIG. 8B, the replacement spacer material 231 contacts the substrate 201 and alternates with the second nanosheet 232. The replacement spacer material 231 fills the voids between the protruding second nanosheets 232.

The replacement spacer material 231 is a dielectric material, for example, a low-k dielectric material having a k of less than 5. In one embodiment, the replacement spacer material 231 is the same material as the dielectric layer 233. The replacement spacer material 231 may be deposited in the lateral recesses 601 by performing a deposition process, for example, ALD, PVD, CVD, or other like processes. The replacement spacer material 231 may include, but is not limited to, silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, silicon borocarbonitride (SiBCN) or any combination thereof.

A wet etch process is performed to remove excess material extending from sidewalls of the second nanosheet 232. The wet etch process may include, but is not limited to, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 8A:
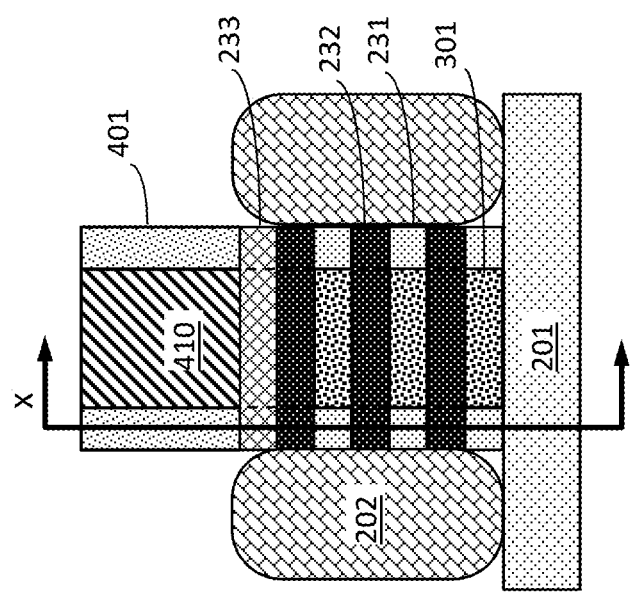
FIG. 8A is a cross-sectional side view after forming source/drain regions.

FIG. 8A is a cross-sectional side view after forming source/drains 202 on the substrate 201 on opposing sides of the dummy gate. FIG. 8B is a cross-sectional side view through the x-axis of FIG. 8A.

The source/drains 202 may be formed by performing an epitaxial growth process to form epitaxial growth on the exposed surfaces of nanosheets 232 and on the substrate 201. In other embodiments (not shown), the source/drain 202 may be formed by incorporating dopants into the substrate 201 and source/drain regions 202.

The epitaxial growth forming the source/drain 801 may be formed using a growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 9:
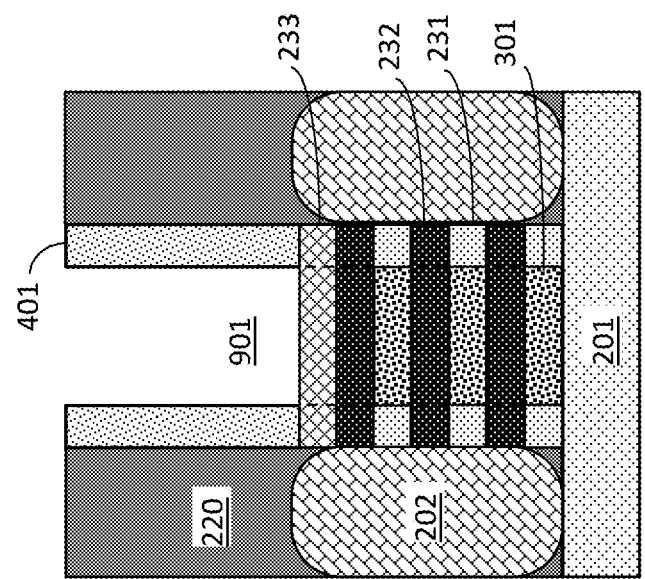

FIG. 9 is a cross-sectional side view after depositing an ILD 220 and removing the sacrificial gate material 410 from the dummy gate to form a gate trench 901 between the gate spacers 401. The ILD 220 is deposited on the dummy gate, the source/drains 202, and the substrate 201. The ILD 202 may include a low-k dielectric material, including but not limited to, silicon dioxide, spin-on-glass, a flowable oxide, a high density plasma oxide, borophosphosilicate glass (BPSG), or any combination thereof. The ILD 220 may be deposited by a deposition process, including, but not limited to CVD, PVD, plasma enhanced CVD (PECVD), atomic layer deposition (ALD), evaporation, chemical solution deposition, or like processes.

A planarization process, for example, chemical mechanical planarization (CMP), is performed to remove a portion of the ILD 220 to expose the sacrificial gate material 410. The sacrificial gate material 410 may be removed by performing a chemical etch process that is selective to (will not substantially etch) the gate spacers 401 and the ILD 220. The chemical etch process may include, but is not limited to, reactive ion etch (RIE), plasma etch, aqueous etching containing an etchant of ammonia, or any suitable combination thereof.

Figure 10:
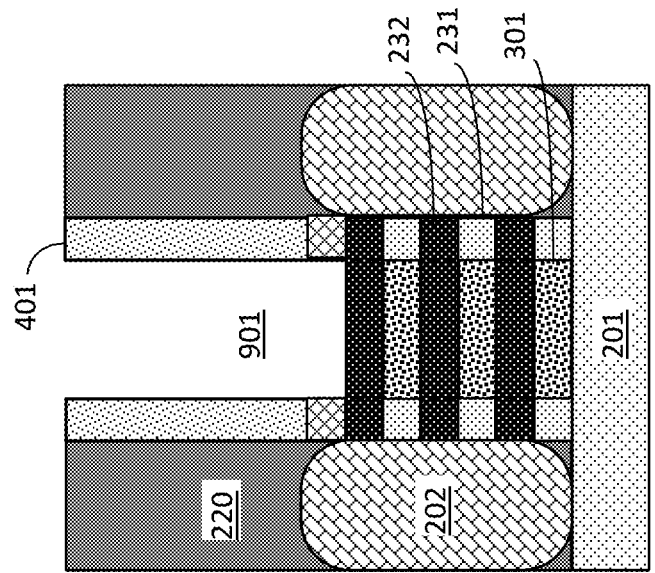

FIG. 10 is a cross-sectional side view after removing the exposed dielectric layer 233 beneath the gate trench 901. Lateral (endwall) portions of the dielectric layer 233 remain beneath the gate spacers 401. The exposed dielectric layer 233 may be removed by performing a selective dry etch process, for example, an RIE process.

Figure 11:
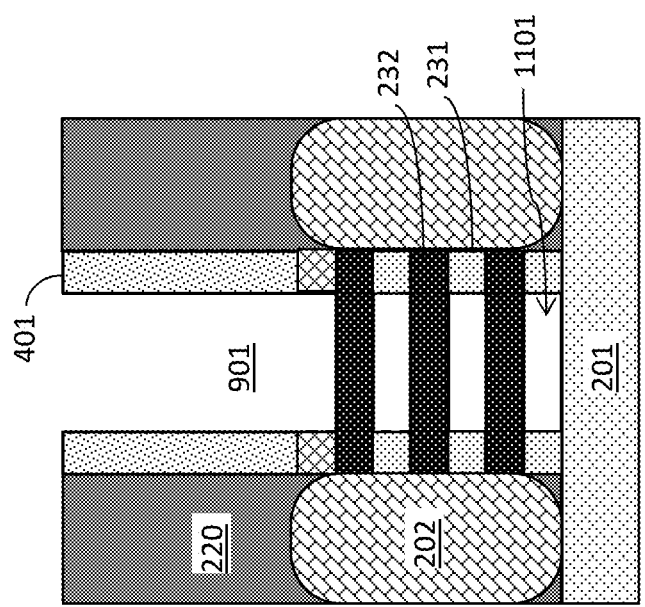

FIG. 11 is a cross-sectional side view after removing remaining portions of the first nanosheet 301 from the nanosheet stack 234. The remaining portions of the first nanosheet 301 are positioned beneath the gate trench 901 and between the second nanosheets 232. The second nanosheets 232 remain suspended in the gate region. Recesses 1101 are formed between the second nanosheets 232 beneath the gate trench 901. The remaining suspended second nanosheets 232 under the gate trench 901 form channel regions.

Remaining portions of the first nanosheet 301 may be removed by performing a selective wet etch process that may include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 12:
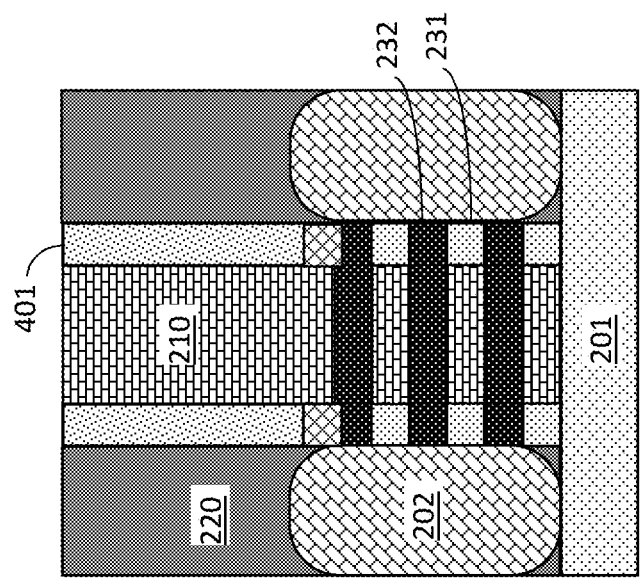

FIG. 12 is a cross-sectional side view after depositing a gate stack 210 in the gate trench 901. The gate stack 210 may be a high-k metal gate formed, for example, by filling the gate trench 901 with one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal and form the gate stack 210.

Figure 13:
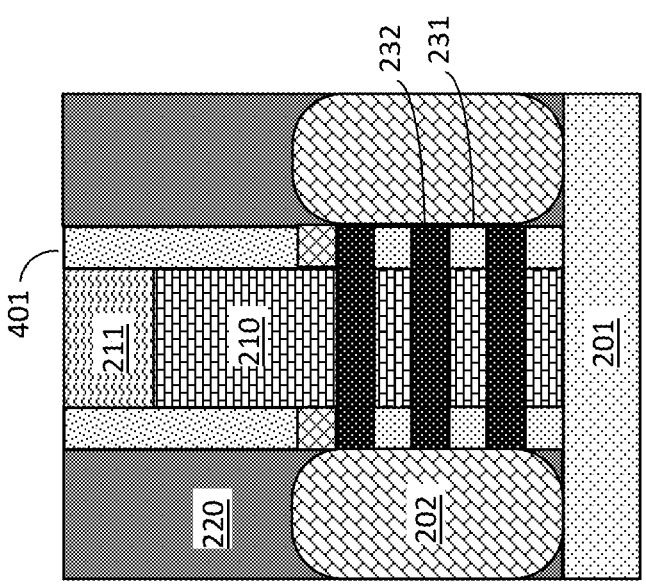

FIG. 13 is a cross-sectional side view after recessing the gate stack 210 and depositing a gate cap 211 on the recessed gate stack 210. A portion of the gate stack 210 may be removed by, for example, employing an RIE containing hydrobromic gas or chlorine.

The gate cap 211 may include a dielectric material, for example, silicon nitride. Other non-limiting examples of dielectric materials for the gate cap 211 include SiOCN or SiBCN. The gate cap 211 forms a hard mask. The gate cap 211 material may be deposited using a deposition process, including, but not limited to, PVD, CVD, PECVD, or any combination thereof.

Figure 14:
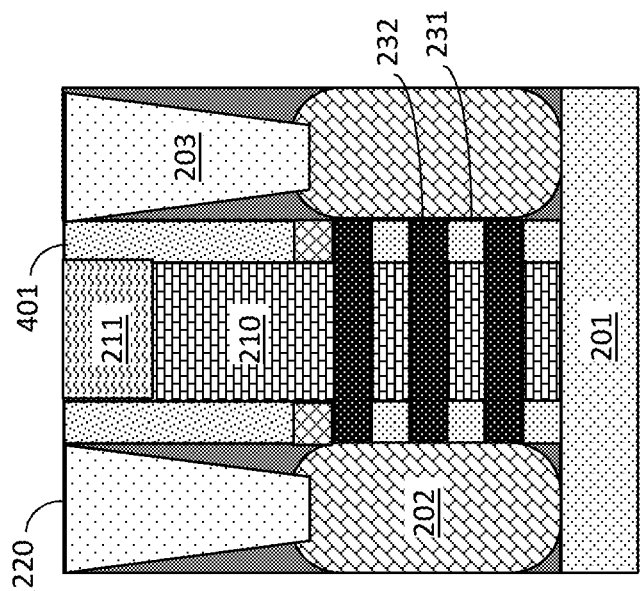

FIG. 14 is a cross-sectional side view after forming source/drain contacts 203 on the source/drains 203. The source/drain contacts 203 contact the gate spacers 401.

The source/drain contacts 203 may be formed by removing portions of the ILD 220 over the substrate 201 to form trenches and filling the trenches with one or more contact materials. The trenches may be formed, for example, by depositing a mask (not shown), for example, a photoresist, on the ILD 220. The mask is patterned over the source/drains 202. The pattern is transferred into the ILD 220 by removing the ILD 220 down to the level of the source/drains 202. The ILD 220 may be removed by a suitable etching process, for example, RIE process. The mask can be removed after forming the trenches.

The source/drain contacts 203 include a metal silicide film that is formed by performing a thermal treatment to a metallic film. The metallic film can be deposited by performing an evaporation process or a sputtering process. The metallic film is then annealed by heating inside a furnace or performing a rapid thermal treatment in an atmosphere that includes pure inert gases. Non-limiting examples of suitable metal silicide materials include titanium silicide, tungsten silicide, cobalt silicide, nickel silicide, molybdenum silicide, platinum silicide, or any combination thereof.

A conductive material is then deposited in contact trenches. The conductive material may be, but is not limited to, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 220, gate cap 211, and the gate spacers 401.

Figure 15B:
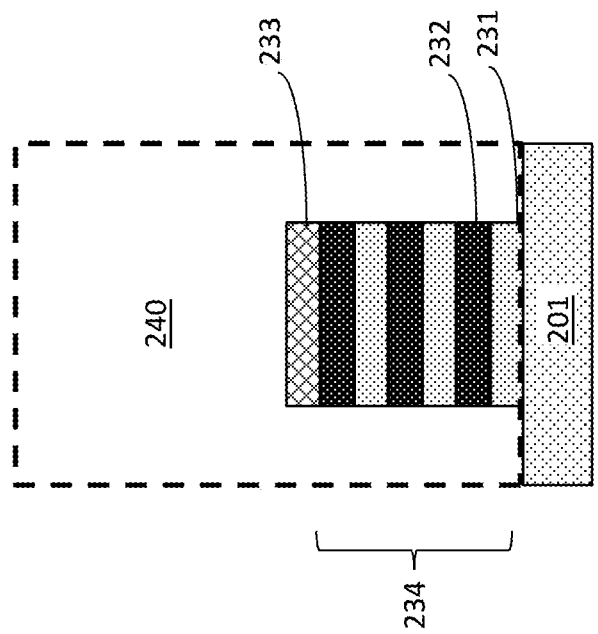
FIG. 15B is a cross-sectional side view through the x-axis of FIG. 15A.
Figure 15A:
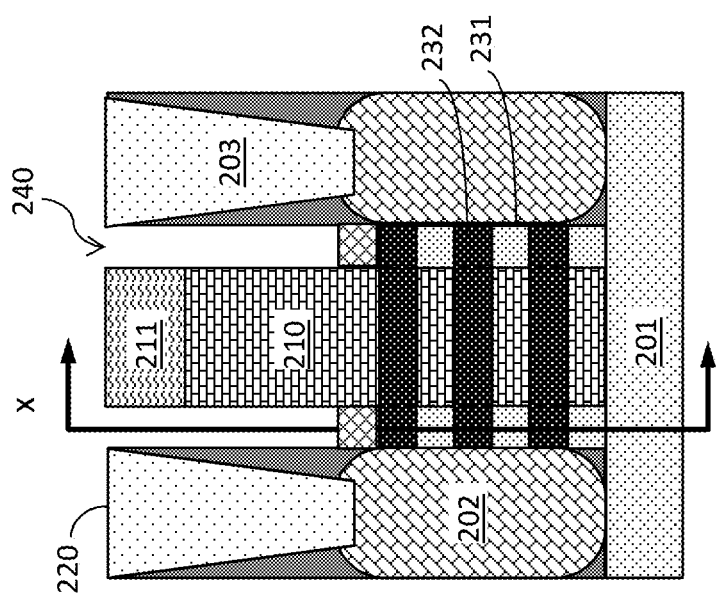
FIG. 15A is a cross-sectional side view after removing the gate spacer.

FIG. 15A is a cross-sectional side view after removing the gate spacers 401. FIG. 15B is a cross-sectional side view through the x-axis of FIG. 15A.

Removing the gate spacers 401 exposes the dielectric layer 233 and forms the air gap spacer 240 between the source/drain contacts 203 and the gate stack 220. The air gap spacers 240 contact the exposed surface of the dielectric layer 233, sidewalls of the gate stack 210, sidewalls of the gate cap 211, sidewalls of the ILD 220 and possibly a portion of the source/drain contact 203.

The gate spacers 401 are removed by performing an etch process that is selective to (will not substantially etch) the gate cap 211, the ILD 220, or the source/drain contacts 203. The gate spacers 401 may be etched by, for example, a wet etch process containing phosphoric acid to selectively etch gate spacer 401 material.

The air gap spacers 240 is a full height spacer that extends from the level of the dielectric layer 233, along sidewalls of the gate stack 210, and over the gate stack 210. The air gap spacer 240 is positioned adjacent to the cap cap 211 may contact a portion of the gate cap 211.

In some embodiments, the air gap spacer 240 has a height in a range from about 10 to about 150 nm. In other embodiments, the air gap spacer 240 has a height in a range from about 50 to about 100 nm.

Figure 16B:
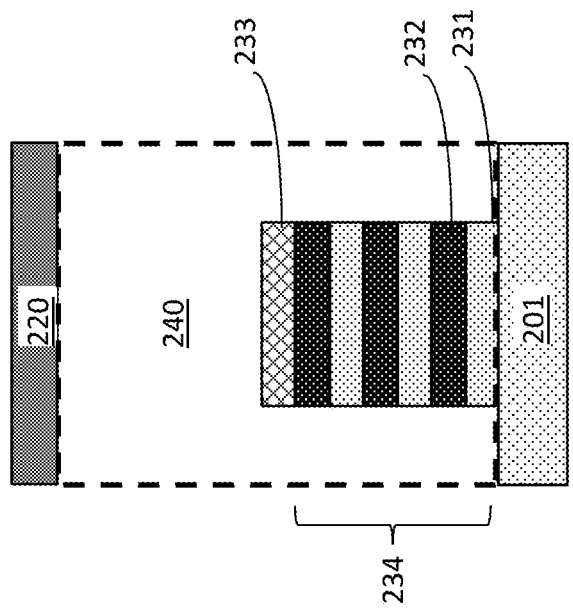
Figure 16A:
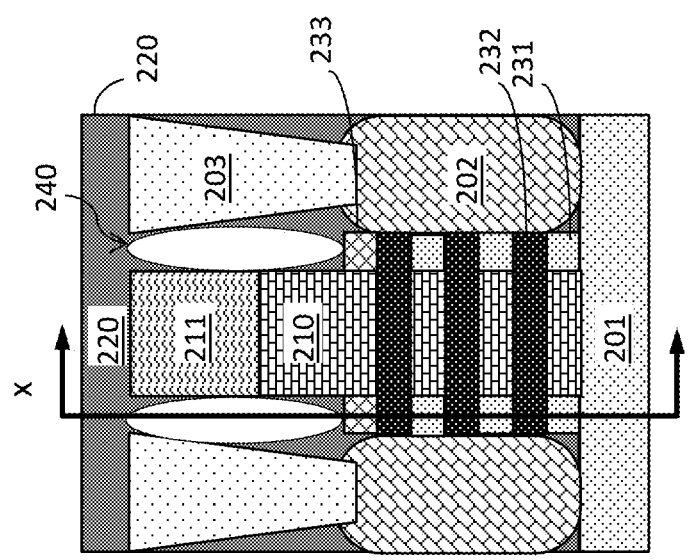
FIG. 16A is a cross-sectional side view after depositing a dielectric layer to seal the air gap spacer.

FIG. 16A is a cross-sectional side view after depositing a dielectric layer to form and seal the air gap spacer 240. FIG. 16B is a cross-sectional side view through the x-axis of FIG. 16A.

The dielectric layer seals the air gap spacer 240 (forms a dielectric seal). The dielectric layer may be the ILD 220 material, or the dielectric layer may be a different dielectric material than the ILD 220. The dielectric layer may be deposited by employing a deposition process, for example, CVD, PVD, plasma enhanced CVD (PECVD), atomic layer deposition (ALD), evaporation, chemical solution deposition, or like processes.

As described above, various embodiments provide semiconductor devices and methods of making semiconductor devices with air gap spacers that reduce the gate-to-contact capacitance and improve the CMOS performance. Although removing the entire spacer to provide a full-height air gap spacer optimally reduces the parasitic capacitance, the fullheight spacer may expose the gate stack (e.g., a high-k gate stack) to air and potentially degrade the gate stack quality. A protective dielectric layer protects the spacer and maintains gate stack quality.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making features of a semiconductor device, the method comprising:
    forming a nanosheet stack comprising a first nanosheet in contact with a substrate and a second nanosheet disposed on the first nanosheet;
    depositing a dielectric layer on the nanosheet stack;
    forming a gate comprising a sacrificial gate material on the nanosheet stack and the dielectric layer, a gate spacer positioned along a sidewall of the gate;
    removing an end portion of the first nanosheet to form a lateral recess beneath the gate spacer;
    depositing a dielectric material in the lateral recess;
    forming a source/drain on the substrate adjacent to the gate;
    replacing the sacrificial gate material with a conductive gate stack;
    removing remaining portions of the first nanosheet; and
    removing the gate spacer to expose the dielectric layer on the nanosheet stack and form an air gap spacer.

2. The method of claim 1, further comprising removing a portion of the conductive gate stack to form a recess and depositing a dielectric material in the recess to form a gate cap.

3. The method of claim 1, wherein the air gap spacer is positioned in contact with the dielectric layer.

4. The method of claim 3, further comprising forming a source/drain contact on the source/drain and adjacent to the gate spacer, and wherein the air gap spacer is positioned in contact with the source/drain contact.

5. The method of claim 1, wherein a gate cap is positioned on the gate stack, and the air gap spacer contacts the gate cap.

6. The method of claim 1, wherein the air gap spacer has a height in a range from about 10 to about 150 nanometers (nm).

7. The method of claim 1, wherein the first nanosheet is silicon, silicon carbide, germanium, silicon germanium, silicon germanium carbon, gallium arsenide, indium arsenide, indium phosphide, or any combination thereof.

8. The method of claim 1, wherein the second nanosheet is silicon, silicon carbide, germanium, silicon germanium, silicon germanium carbon, gallium arsenide, indium arsenide, indium phosphide, or any combination thereof.

9. The method of claim 1, wherein the dielectric material in the lateral recess and the dielectric layer on an exposed surface of the second nanosheet are a low-k dielectric material.

10. A method of making a semiconductor device, the method comprising:
    forming a nanosheet stack comprising a first nanosheet in contact with a substrate and a second nanosheet disposed on the first nanosheet;
    depositing a dielectric layer on the nanosheet stack;
    forming a gate comprising a sacrificial gate material on the nanosheet stack and the dielectric layer, a gate spacer positioned along a sidewall of the gate;
    removing an end portion of the first nanosheet to form a lateral recess beneath the gate spacer;
    depositing a dielectric material in the lateral recess;
    forming a source/drain on the substrate adjacent to the gate;
    replacing the sacrificial gate material with a conductive gate stack;
    removing remaining portions of the first nanosheet; and
    forming a source/drain contact on the source/drain and adjacent to the gate spacer; and
    removing the gate spacer to expose the dielectric layer on the nanosheet stack and form an air gap spacer.

11. The method of claim 10, further comprising removing a portion of the conductive gate stack to form a recess and depositing a dielectric material in the recess to form a gate cap.

12. The method of claim 10, wherein the air gap spacer is positioned in contact with the dielectric layer.

13. The method of claim 12, wherein the air gap spacer is positioned in contact with the source/drain contact.

14. The method of claim 10, wherein a gate cap is positioned on the gate stack, and the air gap spacer contacts the gate cap.

15. The method of claim 10, wherein the air gap spacer has a height in a range from about 10 to about 150 nanometers (nm).

16. The method of claim 10, wherein the first nanosheet is silicon, silicon carbide, germanium, silicon germanium, silicon germanium carbon, gallium arsenide, indium arsenide, indium phosphide, or any combination thereof.

17. The method of claim 10, wherein the second nanosheet is silicon, silicon carbide, germanium, silicon germanium, silicon germanium carbon, gallium arsenide, indium arsenide, indium phosphide, or any combination thereof.

18. The method of claim 10, wherein the dielectric material in the lateral recess and the dielectric layer on an exposed surface of the second nanosheet are a low-k dielectric material.

* * * * *